(12) United States Patent
Perriard et al.

(10) Patent No.: US 12,538,709 B2
(45) Date of Patent: Jan. 27, 2026

(54) DIELECTRIC ELASTOMER ACTUATOR

(71) Applicant: ECOLE POLYTECHNIQUE FEDERALE DE LAUSANNE (EPFL), Lausanne (CH)

(72) Inventors: Yves Perriard, Neuchâtel (CH); Jonathan Chavanne, Châtel-St-Denis (CH); Yoan Civet, Publier (FR); Morgan Almanza, Massy (FR)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 941 days.

(21) Appl. No.: 17/773,067

(22) PCT Filed: Oct. 30, 2020

(86) PCT No.: PCT/IB2020/060228
§ 371 (c)(1),
(2) Date: Apr. 29, 2022

(87) PCT Pub. No.: WO2021/084503
PCT Pub. Date: May 6, 2021

(65) Prior Publication Data
US 2022/0393098 A1 Dec. 8, 2022

(30) Foreign Application Priority Data

Nov. 1, 2019 (CH) .................................... 1382/19

(51) Int. Cl.
*H01L 41/193* (2006.01)
*H01L 41/047* (2006.01)
*H01L 41/083* (2006.01)
*H01L 41/09* (2006.01)
*H10N 30/20* (2023.01)
*H10N 30/50* (2023.01)
(Continued)

(52) U.S. Cl.
CPC ............. *H10N 30/50* (2023.02); *H10N 30/20* (2023.02); *H10N 30/857* (2023.02); *H10N 30/871* (2023.02)

(58) Field of Classification Search
CPC ...... H10N 30/857; H10N 30/20; H10N 30/50; H10N 30/871
See application file for complete search history.

(56) References Cited

U.S. PATENT DOCUMENTS 6,349,141 B1 * 2/2002 Corsaro ................. H04R 17/00
381/431
6,376,971 B1 * 4/2002 Pelrine ..................... H04R 5/02
977/788

(Continued)

OTHER PUBLICATIONS

International Search Report and Written Opinion for PCT/IB2020/060228 dated Dec. 22, 2020, 8 pages.

*Primary Examiner* — Dominick L Plakkoottam
(74) *Attorney, Agent, or Firm* — BLANK ROME LLP

(57) ABSTRACT

A dielectric elastomer actuator comprising:
a plurality of polymer layer;
a plurality of stretchable electrode layers, each polymer layer being sandwiched between two electrode layers so as to control the electric field within the polymer layer;
at least one stretchable charge distribution layer, each charge distribution layer being adjacent to one stretchable electrode layer and/or to one polymer layer.

15 Claims, 4 Drawing Sheets

(51) Int. Cl.
*H10N 30/857* (2023.01)
*H10N 30/87* (2023.01)

(56) References Cited

U.S. PATENT DOCUMENTS

2015/0320295 A1  11/2015  Belson et al.
2016/0231098 A1*  8/2016  Otaka .................... G01B 7/22

* cited by examiner

DIELECTRIC ELASTOMER ACTUATOR

RELATED APPLICATIONS

This application is a national phase of PCT/IB2020/060019, filed on Oct. 26, 2020, which claims the benefit of European Patent Application No. EP19207397.1, filed on Nov. 6, 2019. The entire contents of these applications are hereby incorporated by reference.

FIELD OF THE INVENTION

The present invention concerns a dielectric elastomer actuator. The present invention also relates to actuators based on polymers that convert between electrical energy and mechanical energy.

DESCRIPTION OF RELATED ART

Dielectric elastomer actuators (DEA) transform electric energy into mechanical work. Since they are lightweight and have a high elastic energy density, they are used in multiple applications, including among others artificial muscles.

The structure of a conventional DEA 1 is illustrated on FIG. 1. It comprises a polymer layer 2 with a low conductivity sandwiched between two compliant electrode layers 3. When a voltage is applied between the two electrode layers, an electrostatic pressure arising from Maxwell pressure acts between the electrodes and deforms the polymer layer 2. Those deformations are well controlled and reversible. The amplitude of the deformation depends on the electric field; for example, DEA with a maximum field of 100V/µm have already been applied.

In order to increase the amount of material, it has already been suggested in the prior art to stack a plurality of polymer layers 2 separated by electrode layers 3, as in FIG. 2. In this example, two polymer layers 2 are sandwiched between three electrode layers 3, thus potentially doubling the volume of active material and the force that can be achieved with a given surface and voltage.

It has been noted however that the voltage withstand by the multilayer DEA structure of FIG. 2 is reduced compared to the one withstood by the single layer DEA surrounded by air.

BRIEF SUMMARY OF THE INVENTION

It is therefore an aim of the present invention to propose a DEA that can generate a higher deformation and/or strain.

In particular, an aim is to increase the maximal voltage that can be applied between the electrodes of a multilayer DEA, thus increasing the maximal strain.

The invention starts from the observation that even if the electrode layers are made of a highly conductive material, the charges are also distributed in the air for a single layer DEA. Air becomes less insulate. It is assumed that this spreading of charge smooths the field concentration at edges of the electrode. Thanks to the partial conduction of the air, it results in an electric field reduction that improves the voltage withstand by the film. Stacking of layers blocks the charge spreading at the edge of the encapsulated electrode, resulting in a drastic reduction of the voltage withstand.

Therefore, according to the invention, the dielectric elastomer actuator comprising:

a plurality of polymer layers;

a plurality of stretchable electrode layers, each polymer layer being sandwiched between two electrode layers so as to control the electric field within the polymer layer;

at least one stretchable charge distribution layer, each charge distribution layer being adjacent to one stretchable electrode layer and/or to one polymer layer.

The charge distribution layer achieves a better control of the repartition of electric charges around the electrodes and reduces the risk of field concentration leading to premature breakdown.

The actuator is arranged so that when the polymer layer can be deformed when a voltage is applied between the two stretchable electrode layers.

An electrode layer is considered to be stretchable if it can adapt its shape or size to the changes of the polymer layer when a charge is applied to the polymer layer and without breaking.

A charge distribution layer is considered to be stretchable if it can adapt its shape or size to the changes of the polymer layer when a charge is applied to the polymer layer and without breaking.

In one embodiment, one charge distribution layer is provided between one electrode layer and one polymer layer. The charge distribution layer is preferably adjacent to the electrode layer and to the polymer layer and provides for a conductive path in order to spread charges around the electrode and reduce the electric field concentration near this edge.

One charge distribution layer is preferably provided between each electrode layer and each polymer layer.

In another embodiment, one charge distribution layer is juxtaposed next to an electrode layer.

The surface of the charge distribution layer is preferably larger than the surface of the adjacent electrode layer, thus further reducing the risk of breakdown.

The thickness of at least one charge distribution layer may be variable over its surface, so as to better control the charge distribution.

The thickness of at least one electrode layer may be variable over its surface. In one example, the electrode layer comprises a rounded edge so as to reduce the tip effect and the charge concentration at its edge.

The resistivity of at least one charge distribution layer may be variable over its surface, in a manner that charges is spread more effectively than without this variable resistivity, to smooth the field concentration.

The permittivity of at least one charge distribution layer being variable over its surface, in a manner that reduces the field concentration near the edge of an adjacent electrode layer.

The permittivity of at least one charge distribution layer may be anisotropic. This may be used for controlling the direction of the electric field within the polymer and in the air.

The charge distribution layer may comprise a polymer composite, such as a silicone rubber, with carbon particles.

The concentration and/or dimension of the particles within the substrate may be non-homogeneous for controlling the resistivity and/or the permittivity of the charge distribution layer.

The electrode layers may comprise a polymer composite, such as a silicone rubber, with carbon particles.

The concentration, dimension and/or shape of the carbon particles in the electrode substrate is preferably different than in the charge distribution layer.

The invention is also related to an artificial muscle comprising such an actuator.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1:
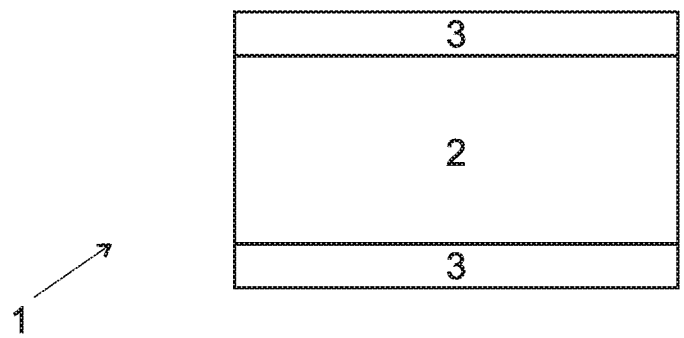
FIG. 1 shows a cross section of a conventional DEA with one single layer of polymer.
Figure 2:
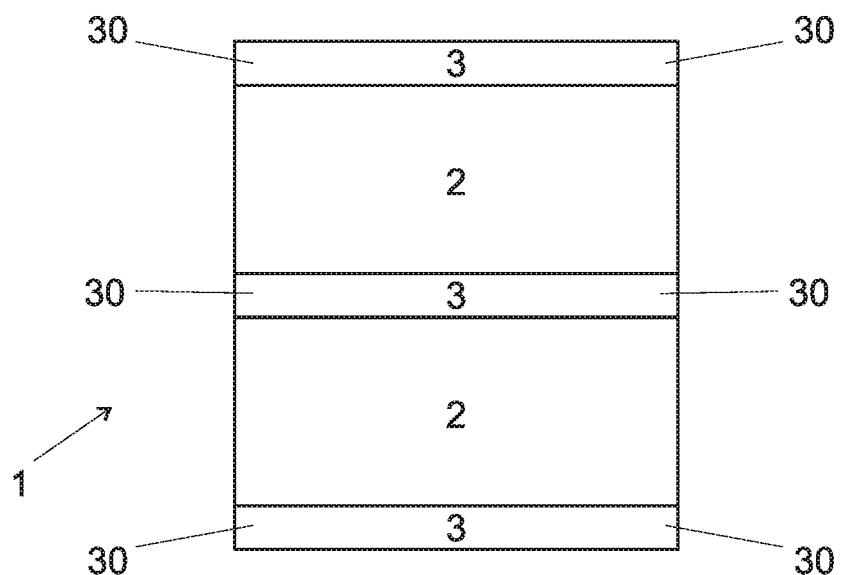
FIG. 2 shows a cross section of a conventional DEA with two layers of polymer.
Figure 3:
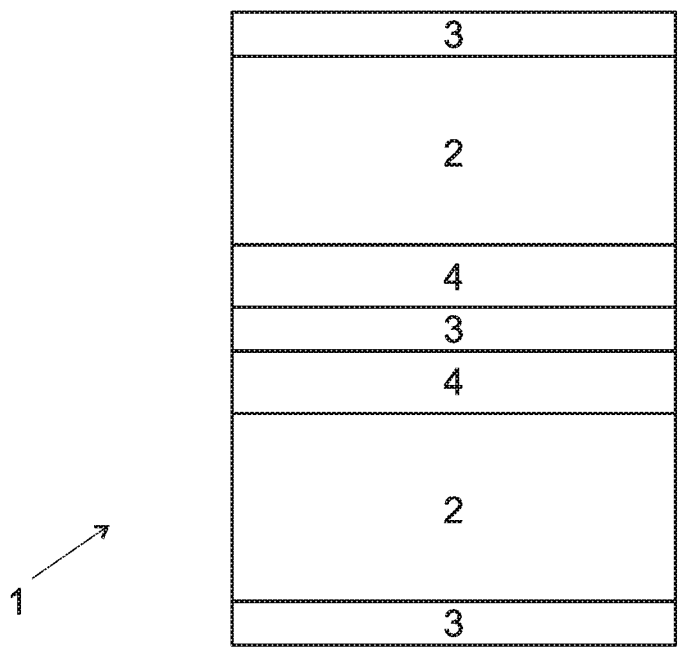
FIG. 3 shows a cross section of a DEA according to a first embodiment of the invention.

FIG. 3 shows an example of dielectric elastomer actuator (DEA) according to a first embodiment of the present invention. In the example, the embodiment comprises two layers 2 of dielectric polymer material sandwiched and separated by three conductive electrode layers 3. Application of a voltage difference between the electrode layers 3 create a deformation of the polymer layer 2. The layer 2 deflects with a change in electric field between the electrode layers 3. The polymer layers 2 may be prestrained.

In order to increase the force or energy for a given voltage and surface, a higher number of polymer layers 2 can be provided, each pair of adjacent layers 2 being separated by an electrode layer 3.

Intermediate charge distribution layers 4 are provided adjacent to the electrode layers 3, in this example on at least one side of at least one of the electrode layers 3, for controlling the repartition of electric charges around the electrode layers 3. The conductivity and thickness of the charge distribution layers 4 is determined to reduce the accumulation of charges at the edges of the electrode layers 3, thus reducing the risk of breakdown.

In one preferred embodiment, a charge distribution layer 4 is provided between at least one electrode layer 3 and the adjacent polymer layers.

In the illustrated example, a charge distribution layer is provided between each side of the intermediate electrode layer 3 and the two adjacent polymer layers 2. In another embodiment (not shown), it would also be possible to provide one charge distribution layer between only one side of the intermediate electrode layer 3 and one of the two adjacent polymer layers 2.

Figure 4:
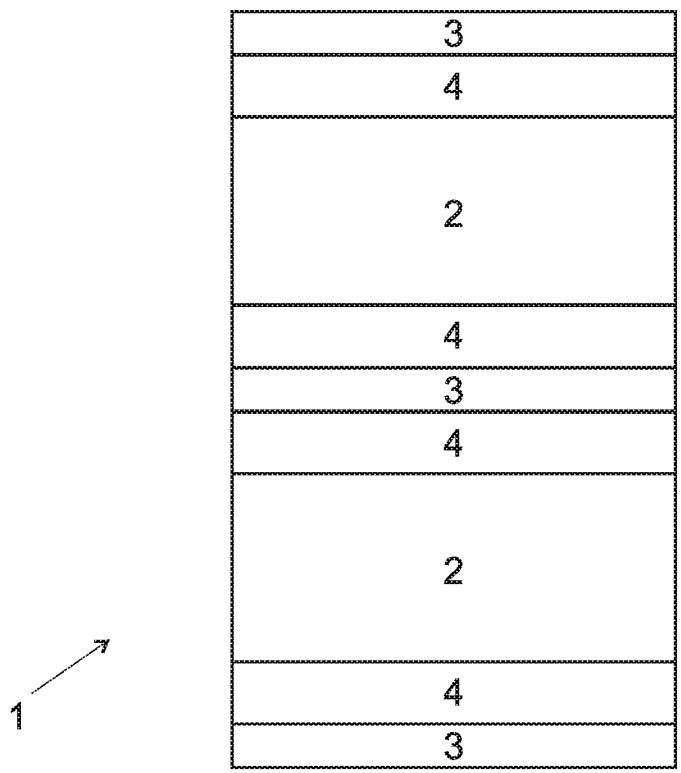
FIG. 4 shows a cross section of a DEA according to a second embodiment of the invention.

In order to reduce the thickness of the arrangement, no charge distribution layer is provided between the electrode layer 3 at each end of the stack and the adjacent polymer layers 2. It is also possible to have a charge distribution layer between each electrode layer and each adjacent polymer layer, as in FIG. 4.

In all embodiments, each of the layers 2,3,4 is stretchable, so that application of a voltage on the electrodes can not only produce a variation of the thickness of the layers 2, but also a deformation, such as for example a bending, of the whole stack. The electrode layers 3 and the charge distribution layers are compliant and conform to the changing shape of the polymer layer while maintaining electrical contact.

In all embodiments, the polymer layers 2 have preferably a thickness in a range between 5 and 300 μm. The thickness of the layer 2 can vary over its surface, for example in order to control its deformation. The electrode layers 3 have preferably a thickness in a range between 0.1 and 20 μm, for example between 5 and 10 μm. The thickness of the layer 3 can vary over its surface, for example with thicker edges in order to reduce the accumulation of electric charges at the edge.

The charge distribution layers 4 is preferably thicker than the electrode layers 3, in order to avoid the risk of creating a concentration of charges at its own edges. In one example, the charge distribution layers have a thickness in a range between 5 and 30 μm, preferably between 10 and 15 μm. The thickness of the layer 4 can vary over its surface, for example with thicker edges in order to control the distribution of charges and reduce the accumulation of electric charges at the edge.

In all embodiments, the polymer layers 2 can be made of an elastosil film. The electrode layers 3 can be done using a liquid silicone with embedded conductive particles, for example embedded metal or fine carbon particles. The charge distribution layers 4 could comprise a silicone matrix with fine carbon particles (carbon based silicone). Carbon based silicone has the advantage of easy deposition and reliable adhesion with the polymer layers 2 and with the electrode layers 3. The diameter of the carbon particles is preferably comprised in a range between 2 and 100 nm. The density of the carbon particles is preferably comprised in a range between 0.01% and 1%. The diameter, form and/or density of carbon particles can vary through the surface of the charge distribution layer, in order to better control the charge distribution.

In all embodiments, the charge distribution layers have an electric conductivity much higher than the conductivity of the dielectric polymer layers 2, but lower than the electrode layers 3. For example, the electric resistivity of the polymer layers 2 may be in a range between $10^{14}$ and $10^{17}$ Ohm·cm; the electric resistivity of the electrode layers 3 may be in a range between 1 and $10^4$ Ohm·cm; the electric resistivity of the charge distribution layers 3 may be in a range between $10^{10}$ and $10^{13}$ Ohm·cm.

In all embodiments, the resistivity of the charge distribution layer may be variable over its surface, thus allowing for a better control of the charge distribution over the surface of the electrode layers. For example, the charge distribution lay may have a variable density of conductive particles in the silicon. The resistivity of the charge distribution layer may for example decreases progressively over its surface.

In all embodiments, the permittivity of the charge distribution layer may be variable over its surface, thus allowing for a better control of the electric field created by the charges over the surface of the electrode layers. The permittivity of the charge distribution layer may be anisotropy, in order to control the direction of the electrical field.

Figure 5:
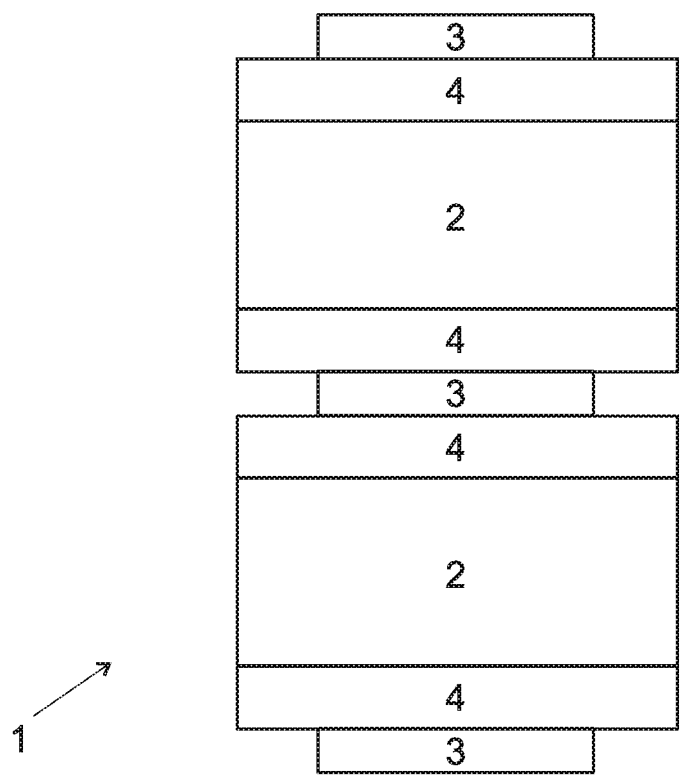
FIG. 5 shows a cross section of a DEA according to a third embodiment of the invention.

In order to further reduce the risk of field concentration, FIG. 5 proposes another embodiment in which the surface of the charge distribution layers 4 is larger than the surface of the adjacent superimposed electrode layers 3, so that the probability of sparks between electrode layers is reduced.

Figure 6:
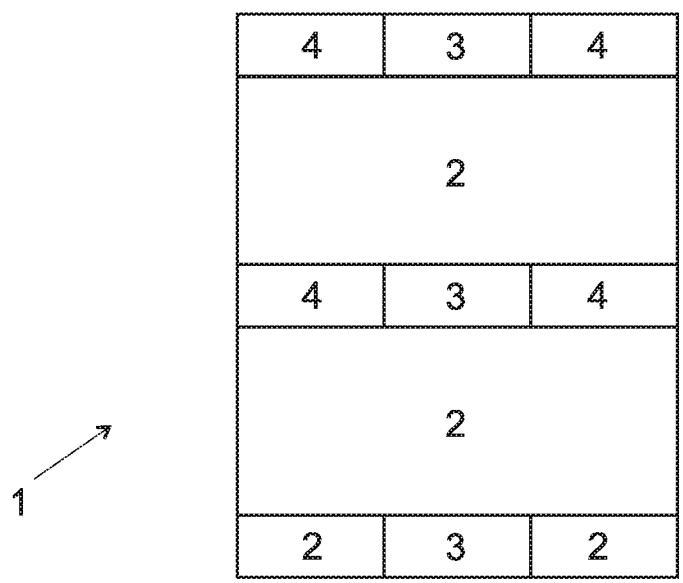
FIG. 6 shows a cross section of a DEA according to a fourth embodiment of the invention.

FIG. 6 proposes a further embodiment in which the charge distribution layers 4 are juxtaposed adjacent to the electrode layers 3, instead of being superimposed adjacent to the electrode layers as in the previous examples. In that example, the surface of the charge distribution layers 4 may be smaller or different than the surface of the adjacent juxtaposed electrode layers 3. The lower conductivity of the charge distribution layers reduces the accumulation of charge at the edge of the electrode layers, thus decreasing the field concentration.

Figure 7:
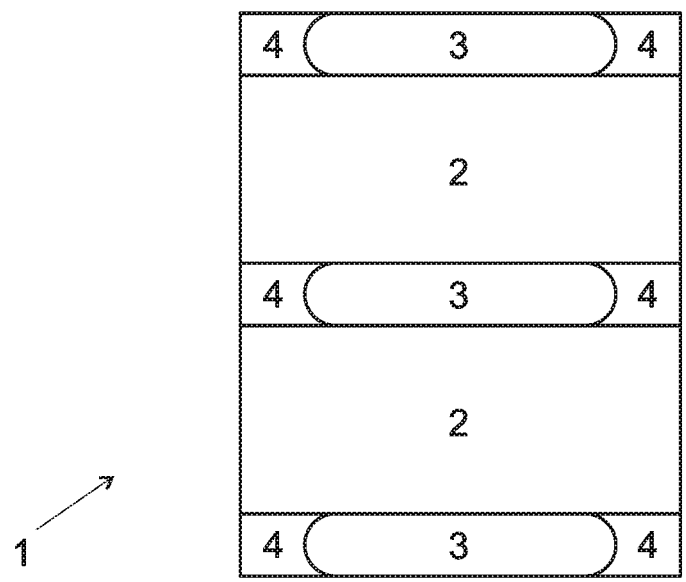
FIG. 7 shows a cross section of a DEA according to a fifth embodiment of the invention.

FIG. 7 proposes a further embodiment in which each charge distribution layer 4 surrounds the edge of an electrode layer 3, resulting again in a reduction of the accumulation of charges and of the electrical fields at the edge of the electrode layer.

Figure 8:
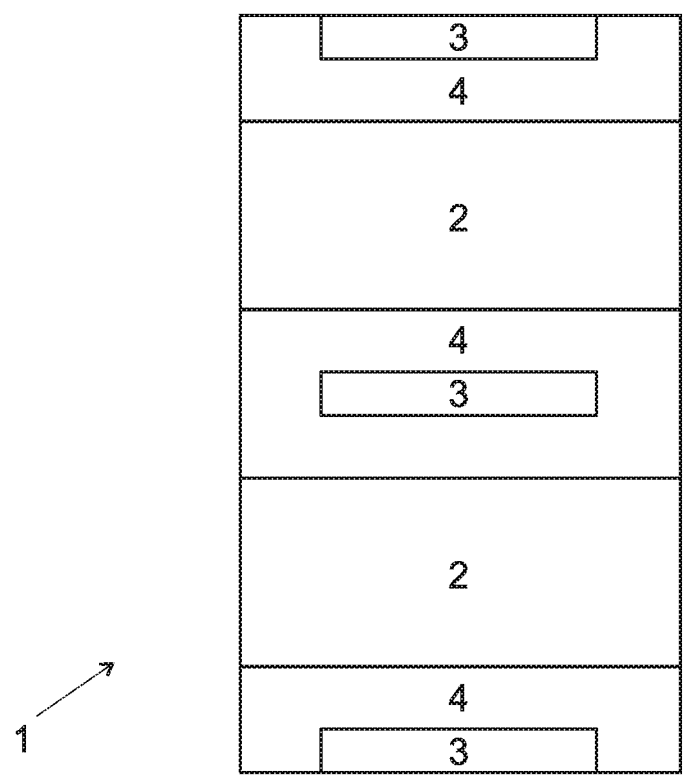
FIG. 8 shows a cross section of a DEA according to a sixth embodiment of the invention.

FIG. 8 proposes a further embodiment in which at least one charge distribution layer 4 surrounds at least three sides of an electrode layer 3, or possibly even 4 sides. The charge spreading is further improved, resulting again in a reduction of the accumulation of charges and of the electrical fields at the edge of the electrode layer.

All embodiments can be used for creating an artificial muscle, i.e. a transducer comprising one or several such dielectric elastomer actuators for generating a force and/or displacement when a voltage is applied.

Features described in relation with different embodiments can be combined.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements or states. Thus, such conditional language is not generally intended to imply that features, elements or states are in any way required for one or more embodiments or that one or more embodiments necessarily include logic for deciding, with or without author input or prompting, whether these features, elements or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied.

The invention claimed is:

1. A dielectric elastomer actuator comprising:
   a plurality of polymer layers;
   a plurality of stretchable electrode layers, each polymer layer being sandwiched between two stretchable electrode layers so as to control the electric field within the polymer layer;
   at least one stretchable charge distribution layer, each charge distribution layer being adjacent to one stretchable electrode layer and/or to one polymer layer,
   wherein each charge distribution layer has an electric resistivity in a range between $10^{10}$ and $10^{13}$ Ohm·cm, wherein said stretchable electrode layer has an electric resistivity in a range between 1 and $10^4$ Ohm·cm and wherein said polymer layer has an electric resistivity in a range between $10^{14}$ and $10^{17}$ Ohm·cm.

2. The actuator of claim 1, wherein one of the charge distribution layers is provided between one of the stretchable electrode layers and one of the polymer layers.

3. The actuator of claim 2, wherein one of the charge distribution layers is provided between each of the stretchable electrode layers and each of the polymer layers.

4. The actuator of claim 1, wherein one of the stretchable charge distribution layers is juxtaposed next to a respective one of the stretchable electrode layers.

5. The actuator of claim 1, wherein at least one of the stretchable charge distribution layers surrounds a respective one of the stretchable electrode layers on at least three sides.

6. The actuator of claim 1, wherein the surface of the one of the stretchable charge distribution layers is larger than the surface of the adjacent respective one of the stretchable electrode layers.

7. The actuator of claim 1, wherein the thickness of said at least one stretchable charge distribution layer is variable over its surface.

8. The actuator of claim 1, wherein the thickness of said at least one stretchable electrode layer is variable over its surface.

9. The actuator of claim 1, wherein the resistivity of said at least one stretchable charge distribution layer is variable over its surface, so as to reduce the concentration of charges at the edge of an adjacent stretchable electrode layer.

10. The actuator of claim 1, wherein the permittivity of at least one stretchable charge distribution layer being variable over its surface, so as to reduce the field concentration near the edge of an adjacent res e one of the stretchable electrode layers.

11. The actuator of claim 1, wherein the permittivity of said at least one stretchable charge distribution layer is anisotropic.

12. The actuator of claim 1, wherein the stretchable charge distribution layers comprise a silicone composite with carbon particles.

13. The actuator of claim 12, wherein the concentration and/or dimension of the carbon particles within the silicone composite being non-homogeneous.

14. The actuator of claim 1, wherein the stretchable electrode layers-comprise a silicone composite with carbon particles.

15. An artificial muscle comprising the actuator of claim 1.

* * * * *